(12) United States Patent
Schardt et al.

(10) Patent No.: US 7,294,861 B2
(45) Date of Patent: Nov. 13, 2007

(54) PHOSPHOR TAPE ARTICLE

(75) Inventors: Craig R. Schardt, St. Paul, MN (US); David Scott Thompson, Woodbury, MN (US); Larry A. Meixner, Woodbury, MN (US); Catherine A. Leatherdale, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 6 days.

(21) Appl. No.: 11/171,947

(22) Filed: Jun. 30, 2005

(65) Prior Publication Data

US 2007/0004065 A1    Jan. 4, 2007

(51) Int. Cl.
*H01L 31/12* (2006.01)
*H01L 21/00* (2006.01)

(52) U.S. Cl. .............. 257/81; 257/99; 438/27; 438/29

(58) Field of Classification Search .......... 438/25, 438/26, 27, 29, 65, 69; 257/79, 81, 98, 99, 257/100
See application file for complete search history.

(56) References Cited

U.S. PATENT DOCUMENTS

| | | | |
|---|---|---|---|
| 5,272,562 A | 12/1993 | Coderre | |
| 5,897,727 A | 4/1999 | Staral et al. | |
| 5,959,316 A | 9/1999 | Lowery | |
| 6,123,890 A | 9/2000 | Mazurek et al. | |
| 6,197,397 B1 | 3/2001 | Sher et al. | |
| 6,280,822 B1 | 8/2001 | Smith et al. | |
| 6,368,699 B1 | 4/2002 | Gilbert et al. | |
| 6,521,916 B2 | 2/2003 | Roberts et al. | |
| 6,600,175 B1 | 7/2003 | Baretz et al. | |
| 6,617,784 B1 | 9/2003 | Abe et al. | |
| 6,623,142 B1 | 9/2003 | Lippman et al. | |
| 6,635,363 B1 | 10/2003 | Duclos et al. | |
| 6,686,676 B2 | 2/2004 | McNulty et al. | |
| 6,727,313 B2 | 4/2004 | Zhou et al. | |
| 6,819,486 B2 | 11/2004 | Ma et al. | |

(Continued)

FOREIGN PATENT DOCUMENTS

JP    2003-197978    7/2003

(Continued)

OTHER PUBLICATIONS

3M Flyer, "3M™ Luminous Film Series 6900", © 3M 2003, 3M IPC.

(Continued)

*Primary Examiner*—Kevin M. Picardat
(74) *Attorney, Agent, or Firm*—William D. Miller

(57) ABSTRACT

A phosphor tape article includes a phosphor layer having a phosphor and a polymeric binder material, a pressure sensitive adhesive layer disposed adjacent the phosphor layer such that light transmitted through the pressure sensitive adhesive layer is received by the phosphor layer, and a release liner disposed on the pressure sensitive adhesive layer. The pressure sensitive adhesive layer is disposed between the release liner and the phosphor layer. The phosphor is suitable for excitation by UV or blue LED light, and the phosphor emission has a characteristic decay rate of less than 1 second. Light emitting devices including pieces of phosphor tape, and methods of making such devices, are also disclosed.

19 Claims, 2 Drawing Sheets

U.S. PATENT DOCUMENTS

| | | | |
|---|---|---|---|
| 7,157,745 B2 | 1/2007 | Blonder et al. | |
| 2002/0017622 A1 | 2/2002 | Kohda | |
| 2002/0158213 A1 | 10/2002 | Matsunaga et al. | |
| 2002/0163719 A1 | 11/2002 | Ma et al. | |
| 2002/0165310 A1 | 11/2002 | Zhou et al. | |
| 2003/0151361 A1 | 8/2003 | Ishizaka | |
| 2003/0189217 A1 | 10/2003 | Imai | |
| 2003/0217806 A1 | 11/2003 | Tait et al. | |
| 2004/0070338 A1 | 4/2004 | Noguchi et al. | |
| 2004/0084681 A1 | 5/2004 | Roberts | |
| 2004/0090161 A1 | 5/2004 | Noguchi et al. | |
| 2004/0145288 A1 | 7/2004 | Ouderkirk et al. | |
| 2004/0145307 A1* | 7/2004 | Odaki | 313/512 |
| 2004/0150991 A1* | 8/2004 | Ouderkirk et al. | 362/231 |
| 2004/0202879 A1 | 10/2004 | Xia et al. | |
| 2005/0006659 A1* | 1/2005 | Ng et al. | 257/99 |
| 2005/0093430 A1* | 5/2005 | Ibbetson et al. | 313/501 |
| 2005/0200269 A1* | 9/2005 | Ng et al | 313/502 |
| 2005/0227388 A1* | 10/2005 | Setlur et al. | 438/22 |
| 2006/0094137 A1* | 5/2006 | Yan | 438/21 |
| 2006/0163601 A1* | 7/2006 | Harle et al. | 257/100 |

FOREIGN PATENT DOCUMENTS

| | | |
|---|---|---|
| JP | 2004-179644 | 6/2004 |
| JP | 2005-108922 | 4/2005 |
| KR | 1020010027835 | 4/2001 |
| WO | WO95/11945 | 5/1995 |
| WO | WO 04/068183 | 12/2004 |
| WO | WO 04/068602 | 12/2004 |

OTHER PUBLICATIONS

3M Product Bulletin, "3M Luminous Film 6900, Product Bulletin 6900, Jul. 2004", 3 pages, 2004.

Sample of 3M™ Luminous Film Series 6900.

Satas, D., "Handbook of Pressure Sensitive Adhesive", 2$^{nd}$ ed., Table of Contents and p. 396, Van Nostrand Reinhold, New York, 1989.

U. S. Application entitled "Optical Film", filed Sep. 14, 2004, having U.S. Appl. No. 10/940,442.

U. S. Application entitled "Methods for Producing Phosphor Based Light Sources", filed Sep. 11, 2004, having U.S. Appl. No. 10/938,277.

U. S. Application entitled "(Meth)acrylate Block Copolymer Pressure Sensitive Adhesives", filed Jul. 29, 2005, having U.S. Appl. No. 10/901,629.

U. S. Application entitled "Optically Clear Pressure Sensitive Adhesive", filed Dec. 17, 2004, having U.S. Appl. No. 11/015,406.

U. S. Application entitled "Structured Phosphor Tape Article", filed Jun. 30, 2005, having U.S. Appl. No. 11/171,933.

* cited by examiner

PHOSPHOR TAPE ARTICLE

BACKGROUND

The present application relates to phosphor tape articles and specifically to phosphor tape articles that include a pressure sensitive adhesive layer.

Many white light sources that utilize LEDs in their construction can have two basic configurations. In one, referred to herein as direct emissive LEDs, white light is generated by direct emission of different colored LEDs. Examples include a combination of a red LED, a green LED, and a blue LED, and a combination of a blue LED and a yellow LED. In another basic configuration, referred to herein as LED-excited phosphor LEDs, a single LED generates a beam in a narrow range of wavelengths, which beam impinges upon and excites a phosphor material to produce visible light. The phosphor can include a mixture or combination of distinct phosphor materials, and the light emitted by the phosphor can include a plurality of narrow emission lines distributed over the visible wavelength range such that the emitted light appears substantially white to the unaided human eye.

One method for producing white (broad-spectrum) light from LEDs is to combine a blue or ultraviolet (UV) emitting LED with a suitable phosphor or blend of phosphors. In practice, phosphor powder is either coated directly onto the LED die or dispersed in the polymer encapsulant surrounding the LED die. One example of a white light LED is formed by combining a blue light emitting InGaN LED encapsulated with a yellow emitting phosphor such as cerium-doped yttrium aluminum garnet (YAG:Ce). White light is produced by this combination when the right amount of phosphor is deposited over the blue die to absorb most, but not all, of the blue light such that unabsorbed blue light and yellow light combine to create light that appears white.

Producing packaged white LEDs having a consistent white color requires careful control of the quality of phosphor deposited over the LED. Too little phosphor causes the LED emission to appear blue white while too much phosphor causes the emission to appear yellow. Accurately controlling the amount of phosphor deposited is difficult as package size (volume) decreases. The encapsulant dispensing system must have a dispensing precision on the order or tens of nanoliters and high phosphor loadings are difficult to dispense due to the non-Newtonian flow behavior of the phosphor loaded resins and clogging of the dispenser from phosphor agglomerates.

Incorporating the phosphor in the encapsulant also presents problems with manufacturing yield and quality control. Due to variation in semiconductor manufacturing and variation in the quality of encapsulant deposited in the LED package, each white LED must be tested and measured after encapsulation to determine its individual color and brightness. Based on this testing, the white light LEDs are sorted into bins. White LEDs that are too far out of tolerance cannot be reworked and are scrapped. Bubbles trapped in the encapsulant and inhomogeneous distribution of phosphor are other problems that are inherent in current white LED production and lead to additional yield loss.

BRIEF SUMMARY

Phosphor tape articles are disclosed herein that include a pressure sensitive adhesive layer. The phosphor tape articles can be adhered to encapsulated LEDs to produce light emitting devices that possess greater color consistency and/or predictability.

With regard to the phosphor tape article itself, such an article can include: a phosphor layer having a phosphor and a polymeric binder material; a pressure sensitive adhesive layer disposed adjacent the phosphor layer such that light transmitted through the pressure sensitive adhesive layer is received by the phosphor layer; and a release liner disposed on the pressure sensitive adhesive layer. The phosphor desirably has a decay rate of less than 1 second. The pressure sensitive adhesive layer is disposed between the release liner and the phosphor layer.

With regard to light emitting devices that may incorporate a phosphor tape, such devices can include an encapsulated ultraviolet or blue LED die and a phosphor tape disposed thereon. The encapsulated LED die includes the LED die disposed within a transparent encapsulating material. The phosphor tape includes a phosphor layer including a phosphor and a polymeric binder material, and a pressure sensitive adhesive layer disposed adjacent the phosphor layer. The pressure sensitive layer is disposed between the phosphor layer and the transparent encapsulating material.

Methods of forming a light emitting devices using phosphor tapes are also disclosed. One illustrative method includes providing a phosphor tape article having a phosphor layer including a phosphor and a polymeric binder material, and a pressure sensitive adhesive layer adjacent the phosphor layer, providing an encapsulated LED die including an LED die disposed within a transparent encapsulating material, the transparent encapsulating material having an encapsulant surface, and adhering the phosphor tape article to the encapsulant surface to form a light emitting device.

These and other aspects of this application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

The disclosure may be more completely understood in consideration of the following detailed description of various embodiments in connection with the accompanying drawings, where like reference numerals designate like elements, and where.

DETAILED DESCRIPTION OF ILLUSTRATIVE EMBODIMENTS

Figure 1:
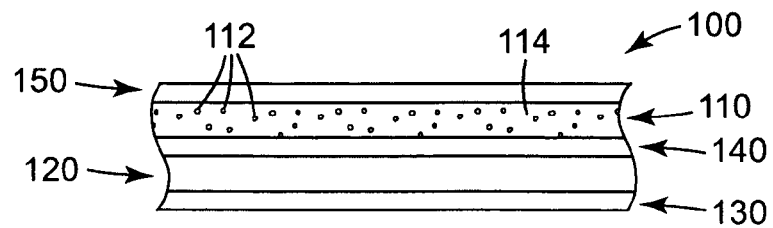
FIG. 1 is a schematic cross-sectional view of an illustrative phosphor tape article.

FIG. 1 is a schematic cross-sectional view of an illustrative phosphor tape article 100. The phosphor tape article 100 includes a phosphor layer 110 disposed adjacent a pressure sensitive adhesive layer 120 such that light transmitted through the pressure sensitive adhesive layer 120 is received by the phosphor layer 110. In this regard, "adjacent" denotes a relative positioning of two articles that are near one another; adjacent items can be touching, or separated by one or more layers. Moreover, the phosphor tape article 100 can optionally include one or more substrate layers 140 disposed between the phosphor layer 110 and the pressure sensitive adhesive layer 120. An optional release liner layer 130 can be disposed on the pressure sensitive adhesive layer 120 on a side opposite the phosphor layer. An outer protective layer or hardcoat layer 150 can also be disposed atop or adjacent the phosphor layer 110.

The phosphor layer 110 includes a phosphor 112 and a polymeric binder material 114. "Polymeric" or "polymer" will be understood to include polymers, copolymers, oligomers and combinations thereof, as well as polymers, oligomers, or copolymers that can be formed in a miscible blend. The phosphor 112 is preferably highly efficient and suitable for use with LED devices, the phosphor desirably having a decay rate of less than five seconds, alternatively less than 1, 0.1, 0.01, or 0.001 second. The decay rate in this regard refers to the characteristic time $\tau$ it takes for the phosphor emission to decay to 1/e (about 37%) of its initial intensity after the excitation light is turned off. The polymeric binder 114 can be any useful material such as, for example, fluoropolymers, polyacrylates, epoxies, silicones, polycarbonates, and polyimides. In many embodiments, the polymeric binder 114 has a low absorption for the excitation light (supplied, for example, by an LED) and a low absorption for the phosphor 112 emission.

Illustrative embodiments disclosed herein are operative with a variety of phosphor materials or blends of phosphor 112 materials. In many embodiments, the phosphor materials are inorganic in composition, having excitation wavelengths in the 300-475 nanometer range and emission wavelengths in the visible wavelength range. In this regard, visible light refers to light that is perceptible to the unaided human eye, generally in the wavelength range from about 400 to 700 nm. In the case of phosphor materials having a narrow emission wavelength range, a mixture of phosphor materials can be formulated to achieve the desired color balance, as perceived by the viewer, for example a mixture of red-, green- and blue-emitting phosphors. Phosphor materials having broader emission bands are useful for phosphor mixtures having higher color rendering indices. Phosphors that convert light in the range of about 300 to 475 nm to longer wavelengths are known. See, for example, the line of phosphors offered by Phosphor Technology Ltd., Essex, England. Phosphors include rare-earth doped garnets, silicates, and other ceramics. In some embodiments, the phosphor is selected to provide a light source emission of one color such as for example, green or red. In other embodiments, the phosphor is selected to provide a light source that emits white light. "White light" here refers to light that stimulates the red, green, and blue sensors in the human eye to yield an appearance that an ordinary observer would consider white. Such light may be biased to the red (commonly referred to as warm white light) or to the blue (commonly referred to as cool white light), and can have a color rendering index of up to 100.

The phosphor (fluorescent material) 112 can be or comprise inorganic particles, organic particles, or a combination thereof. Useful inorganic particles include doped garnets (such as YAG:Ce and (Y,Ga)AG:Ce), aluminates (such as $Sr_2Al_{14}O_{25}$:Eu and BAM:Eu), silicates (such as europium doped strontium barium silicate), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders or nanoparticle phosphor powders. Another class of useful inorganic particles are quantum dot phosphors made of semiconductor nanoparticles including Si, Ge, CdS, CdTe, ZnS, ZnSe, ZnTe, PbS, PbSe, PbTe, InN, InAs, AlN, AlP, AlAs, GaN, GaP, GaAs, and combinations thereof. The surface of the quantum dot can be at least partially coated with an organic molecule to prevent agglomeration and increase compatibility with the binder. In some cases the semiconductor quantum dot may be made up of several layers of different materials in a core-shell construction.

In many embodiments, the phosphor exhibits durable and stable optical properties. The phosphor layer can consist of a blend of different types of phosphors in a single layer or a series of layers, each containing one or more types of phosphors. The inorganic phosphor particles in the phosphor layer may vary in size (diameter) and they may be segregated such that the average particle size is not uniform across the cross-section of the phosphor layer. In some embodiments, the phosphor particles have a size in the 1 to 25 micrometer range.

The phosphor layer 110 can have any useful thickness. In many embodiments, the phosphor layer 110 has a thickness in a range from 10 to 500 micrometers, or from 10 to 250 micrometers, or from 25 to 150 micrometers. The phosphor layer 110 can be coated out to form a layer having a substantially uniform phosphor coating weight along the layer. In some cases, the phosphor coating weight can be uniform to within 0% to 5%, 0% to 4%, 0% to 3%, 0% to 2%, or 0% to 1% of a nominal or average value along the phosphor layer 110 length and/or width. The nominal value of the phosphor coating weight can be selected depending on the layer thickness and desired output color. Where the phosphor tape article 100 is made on a conventional film line, the width of phosphor layer 110 may be a meter or more, and the length may be many tens or hundreds of meters or more.

The phosphor layer 110 can be substantially light scattering. In many embodiments, the phosphor layer 110 has a haze value in a range from 50 to 100%, or from 75 to 100%, or from 90 to 100%, or from 95 to 100%, or from 99 to 100%. The phosphor layer 110 haze value can be measured by accepted test methods and instruments, including standard test method ASTM D1003-95.

Figure 2:
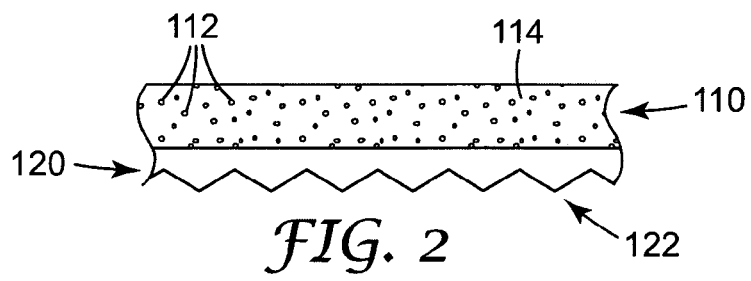
FIG. 2 is a schematic cross-sectional view of another illustrative phosphor tape article.

The pressure sensitive adhesive layer 120 can be formed from a variety of polymeric materials. The Pressure-Sensitive Tape Council (Test Methods for Pressure Sensitive Adhesive Tapes (1994), Pressure Sensitive Tape Council, Chicago, Ill.) has described pressure sensitive adhesives (PSAs) as material with the following properties: (1) aggressive and permanent tack, (2) adherence with no more than finger pressure, (3) sufficient ability to hold onto an adherand, (4) sufficient cohesive strength, and (5) requires no activation by an energy source. PSAs are normally tacky at assembly temperatures, which is generally room temperature or greater (i.e., about 20° C. to about 30° C. or greater). In many embodiments, the PSA has a low absorption for the LED emission and the phosphor emission. The PSA chemistry can be selected to bond strongly with an LED encapsulant material. Exemplary PSAs exhibit a low initial bond strength to allow for reworking and build adhesion over time to a strong bond. In some embodiments, the PSA can cure or cross-link (via heat or light) to create a permanent or structural bond. The PSA layer 120 can be any useful thickness such as, for example, 10 to 250 micrometers, or 10 to 150 micrometers, as desired. In some embodiments, the PSA layer 120 is patterned (as shown in FIG. 2) to facilitate the removal of air from an interface between the PSA and the adhered substrate during application.

Materials that function well as PSAs are polymers designed and formulated to exhibit the requisite viscoelastic properties resulting in a desired balance of tack, peel adhesion, and shear holding power at the assembly temperature. Polymers used for preparing PSAs are natural rubber-, synthetic rubber- (e.g., styrene/butadiene copolymers (SBR) and styrene/isoprene/styrene (SIS) block copolymers), silicone elastomer-, poly alpha-olefin-, and various (meth)acrylate- (e.g., acrylate and methacrylate) based polymers. Of these, (meth)acrylate-based polymer PSAs are an example of one examplary class of PSA due to their optical clarity, permanence of properties over time (aging stability), and versatility of adhesion levels, to name just a few benefits. It is known to prepare PSAs comprising mixtures of certain (meth)acrylate- based polymers with certain other types of polymers (Handbook of Pressure Sensitive Adhesive Technology, 2nd Edition, Edited by D. Satas, page 396, 1989). In some embodiments, the PSA is formed from a silicone material. In some embodiments, the PSA layer includes a curing or cross-linking agent. In further embodiments, the PSA layer can include a tackifying agent.

Particularly suitable PSAs exhibiting good environmental stability are described in the following three references: (1) published U.S. application US 2004/0202879 (Xia et al.); (2) U.S. application Ser. No. 10/901,629 entitled "(Meth) acrylate Block Copolymer Pressure Sensitive Adhesives" and filed Jul. 29, 2004; and (3) U.S. application Ser. No. 11/015,406 entitled "Optically Clear Pressure Sensitive Adhesive" and filed Dec. 17, 2004. Each of these references is incorporated herein by reference in its entirety. The first reference describes, among other things, adhesive compositions comprising a blend of: a majority of a pressure sensitive adhesive component comprising at least one polymer with an acid or base functionality; a high Tg polymer with an weight average molecular weight greater than 100,000 comprising an acid or base functionality; and a crosslinker; wherein the functionality of the pressure sensitive adhesive component and the functionality of the high Tg polymer form an acid-base interaction when mixed. The second reference describes, among other things, optically clear pressure sensitive adhesive layers comprising a (meth) acrylate block copolymer including: (i) at least two A block polymeric units that are the reaction product of a first monomer composition comprising an alkyl methacrylate, an aralkyl methacrylate, an aryl methacrylate, or a combination thereof, each A block having a Tg of at least 50° C., the (meth)acrylate block copolymer comprising 20 to 50 weight percent A block; and (ii) at least one B block polymeric unit that is the reaction product of a second monomer composition comprising an alkyl (meth)acrylate, a heteroalkyl (meth)acrylate, a vinyl ester, or a combination thereof, the B block having a Tg no greater than 20° C., the (meth)acrylate block copolymer comprising 50 to 80 weight percent B block. The third reference describes, among other things, optically clear pressure sensitive adhesive films that include: a pressure sensitive adhesive formed by polymerizing a $(C_1$-$C_8)$alkyl (meth)acrylate monomer; and a plurality of surface modified nanoparticles dispersed in the pressure sensitive adhesive.

Curing or cross-linking agents can increase cohesive strength of the PSA. Two main types of curing or crosslinking additives are commonly used. The first crosslinking additive is a thermal crosslinking additive such as a multifunctional aziridine. One example is 1,1'-(1,3-phenylene dicarbonyl)-bis-(2-methylaziridine) (CAS No. 76522-64-4), referred to herein as "Bisamide". Such chemical crosslinkers can be added into solvent-based PSAs after polymerization and activated by heat during oven drying of the coated adhesive. In some cases, chemical crosslinkers that rely upon free radicals to carry out the crosslinking reaction may be employed. Reagents such as, for example, peroxides serve as a source of free radicals. When heated sufficiently, these precursors will generate free radicals which bring about a crosslinking reaction of the polymer. One example of a free radical generating reagent is benzoyl peroxide. If present, free radical generators are usually required only in small quantities, but generally require higher temperatures to complete a crosslinking reaction than those required for the bisamide reagent. A second type of chemical crosslinker or curing agent is a photosensitive crosslinker or a photocuring agent which is activated by high intensity light (such as ultraviolet and/or blue light.) Two useful photosensitive crosslinkers are benzophenone and/or a triazine, for example, 2,4-bis(trichloromethyl)-6-(4-methoxy-phenyl)-s-triazine. These crosslinkers are activated by UV light generated from artificial sources such as medium pressure mercury lamps or a UV blacklight. "UV" or "ultraviolet" refers to light whose wavelength is in the range from about 300 to about 400 nm. Hydrolyzable, free-radically copolymerizable crosslinkers, such as monoethylenically unsaturated mono-, di-, and trialkoxysilane compounds including, but not limited to, methacryloxypropyltrimethoxysilane (available from Gelest, Inc., Tullytown, Pa.), vinyldimethylethoxysilane, vinylmethyldiethoxysilane, vinyltriethoxysilane, vinyltrimethoxysilane, vinyltriphenoxysilane, and the like, are also useful crosslinking agents. Crosslinking may also be achieved using high energy electromagnetic radiation such as gamma or e-beam radiation. In some embodiments crosslinker is not present in the PSA layer. Tackifiers and/or plasticizers may be added to aid in optimizing the ultimate modulus, Tg, tack and peel properties of the PSA. Examples of useful tackifiers include, but are not limited to, rosin, rosin derivatives, polyterpene resins, coumarone-indene resins, and the like. Plasticizers which may be added to the adhesive may be selected from a wide variety of commercially available materials. In each case, the added plasticizer can be compatible with the PSA. Representative plasticizers include polyoxyethylene aryl ether, dialkyl adipate, 2-ethylhexyl diphenyl phosphate, t-butylphenyl diphenyl phosphate, (2-ethylhexyl) adipate, toluenesulfonamide, dipropylene glycol dibenzoate, polyethylene glycol dibenzoate, polyoxypropylene aryl ether, dibutoxyethoxyethyl formal, and dibutoxyethoxyethyl adipate.

When present, the substrate layer 140 can be formed from a polymeric material such as, for example a polyolefin, a polyester, and/or a polyacrylate. The substrate layer 140 can have any useful thickness such as, for example, from 10 to 1000 micrometers, or from 10 to 500 micrometers, or from 10 to 100 micrometers. In some embodiments the substrate layer 140 provides a base or web of material on which to coat the phosphor layer 110 and/or the PSA layer 120. In other embodiments, the phosphor layer 110 is coated directly onto the PSA layer 120. In further embodiments, the PSA layer 120 is coated directly onto the phosphor layer 110.

An optional polymeric release layer 130 protects the properties of the pressure sensitive adhesive layer 120 so that the article 100 can be manipulated and subsequently separated from the release layer 130 to expose the PSA layer 120. These release polymers rely on low surface energy to deliver the release property. A partial listing of low surface energy functional groups on polymers includes silicones, fluorocarbons, and long chain, crystalline hydrocarbons. The release liner layer 130 can have any useful thickness such as, for example from 10 to 100 micrometers.

In some embodiments, a protective or hardcoat layer 150 can be disposed on the phosphor layer 110. This hardcoat layer 150 may contain inorganic oxide particles, e.g., silica, of nanometer dimensions dispersed in a binder precursor resin matrix. The optional hardcoat can have any useful thickness such as, for example, in a range of 1 to 15 micrometers.

FIG. 2 is a schematic cross-sectional view of another illustrative phosphor tape article. In this embodiment, a PSA layer 120 is disposed directly onto phosphor layer 110. The PSA layer 120 and the phosphor layer 110 are described above, except that in the embodiment of FIG. 2 the PSA layer has a structured surface 122 on a side opposite the phosphor layer 110.

The structured surface 122 can have specific shapes or microstructures that allow egress of air or other fluids trapped at the interface between the PSA 120 and a substrate during a lamination process. The microstructures of structured surface 122 can allow the PSA layer 120 to be uniformly laminated to a substrate without forming bubbles that could cause imperfections in the resulting laminate. These microstructures (and corresponding microstructures on a mating release liner) can be microscopic in at least two dimensions. The term microscopic as used herein refers to dimensions that are difficult to resolve by the human eye without the aid of a microscope. The microstructures of structured surface 122 in the PSA layer 120 may be made as described in U.S. Pat. No. 6,197,397 (Sher et al.) and U.S. Pat. No. 6,123,890 (Mazurek et al.), which are each incorporated herein by reference. The topography may be created in the PSA layer 120 by any contacting technique, such as casting, coating or compressing. The topography may be made by at least one of: (1) casting the PSA layer on a tool with an embossed pattern, (2) coating the PSA layer onto a release liner with an embossed pattern, or (3) passing the PSA layer through a nip roll to compress the PSA layer against a release liner with an embossed pattern. The topography of the tool used to create the embossed pattern may be made using any known technique, such as, for example, chemical etching, mechanical etching, laser ablation, photolithography, stereolithography, micromachining, knurling, cutting or scoring. The microstructures 122 may form a regular or a random array or pattern. Regular arrays or patterns include, for example, rectilinear patterns, polar patterns, cross-hatch patterns, cube-corner patterns. The patterns may be aligned with the direction of the carrier web, or may be aligned at an angle with respect to the carrier web. The pattern of microstructures of the PSA structured surface can define substantially continuous open pathways or grooves that extend into the PSA layer 120 from an exposed surface. The pathways either terminate at a peripheral portion of the PSA layer 120 or communicate with other pathways that terminate at a peripheral portion of the article. When the article is applied to a substrate, the pathways allow egress of fluids (such as air) trapped at an interface between the PSA layer 120 and a substrate. Preferably, the structured surface 122 disappears as the PSA layer 120 conforms to the shape of the substrate to which it is applied, e.g., an encapsulant. The shapes of the microstructures may vary widely depending on the level of fluid egress and peel adhesion required for a particular application, as well as the surface properties of the substrate. Protrusions and depressions may be used, and the microstructures may be continuous to form grooves in the PSA layer 120. Suitable shapes include hemispheres, right pyramids, trigonal pyramids, square pyramids, quadrangle pyramids, and "V" grooves, for reasons of pattern density, adhesive performance, and readily available methodology for producing the microstructures. The microstructures may be systematically or randomly generated.

The phosphor tape described above represents a significant improvement over the current practice for producing white light emitting phosphor-based LEDs. By using the phosphor tape, white light LEDs can be assembled with ease and can be produced using manual or automated assembly lines. The uniform properties of the phosphor tape provide greater color consistency and may reduce or eliminate the need for inspection and sorting of the resultant white LEDs. In many embodiments, the phosphor tape is at least temporarily re-positionable and may be removed after application in the event that an assembled device does not meet the desired specifications. In addition, a manufacturer with a supply of phosphor tapes of varying phosphor composition and thickness will have the ability to maintain a minimal inventory and produce white LEDs on-demand from standard blue or UV LEDs.

Figure 3:
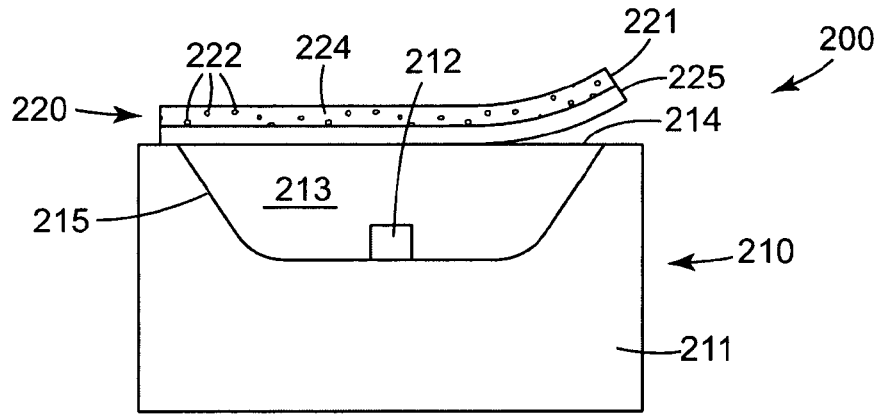
FIG. 3 is a schematic cross-sectional view of an illustrative piece of phosphor tape being applied to an encapsulated LED.

FIG. 3 is a schematic cross-sectional view of an illustrative phosphor tape article 220, such as any described herein, being applied to an encapsulated LED 210 to form a light emitting device 200.

"LED" in this regard refers to a diode that emits light, whether visible, ultraviolet, or infrared. It includes incoherent encased or encapsulated semiconductor devices marketed as "LEDs", whether of the conventional or super radiant variety. An "LED die" is an LED in its most basic form, i.e., in the form of an individual component or chip made by semiconductor processing procedures. The component or chip can include electrical contacts suitable for application of power to energize the device. The individual layers and other functional elements of the component or chip are typically formed on the wafer scale, the finished wafer can then be diced into individual piece parts to yield a multiplicity of LED dies.

The encapsulated LED 210 includes an ultraviolet or blue light emitting LED die 212 disposed within an encapsulating material 213. The LED die 212 may be the only LED die or may be one of a plurality of LED dies disposed within the encapsulated LED 210. The LED die 212 is shown disposed on a surface 215 of the LED package 211, the surface 215 defining a local aperture for light emitted by the LED die 212. In many embodiments, surface 215 is reflective. The encapsulating material 213 has an outer surface 214. The encapsulating material 213 can have any useful refractive index.

A piece of phosphor tape 220 is disposed adjacent to or on the transparent encapsulating material outer surface 214. The phosphor tape 220 can be sized to at least cover the transparent encapsulating material outer surface 214. The phosphor tape 220 can be laminated onto the transparent encapsulating material outer surface 214, as illustrated in FIG. 3. Outer surface 214 may have a variety of surface configurations. In particular, outer surface 214 can be flat or curved (whether concave or convex), or, for example, can have distinct top and side surfaces to which the piece of phosphor tape 220 is applied.

The phosphor tape 220 includes a phosphor layer 221 having a phosphor layer refractive index (typically equal to a binder material 224 refractive index) and a PSA layer 225 having a PSA layer refractive index. In many embodiments, the encapsulating material refractive index and the PSA layer refractive index are both within a value of 0.1 of each other. In another embodiment, the PSA layer refractive index and the phosphor layer refractive index are both within a value of 0.1 of each other. In a further embodiment, the encapsulating material refractive index and the PSA layer refractive index and the phosphor layer refractive index are all within a value of 0.1 of each other. In a further embodiment, the PSA layer refractive index is intermediate of the encapsulating material refractive index and the phosphor layer refractive index.

The LED excitation light can illuminate the underside of a phosphor tape article 220, which absorbs at least a portion of the excitation light and emits light at multiple wavelengths in the visible region to provide a source appearing substantially white to the ordinary observer. LED excitation light can be any light that an LED source can emit. LED excitation light can be UV, or blue light. Blue light also includes violet and indigo light.

Figure 4:
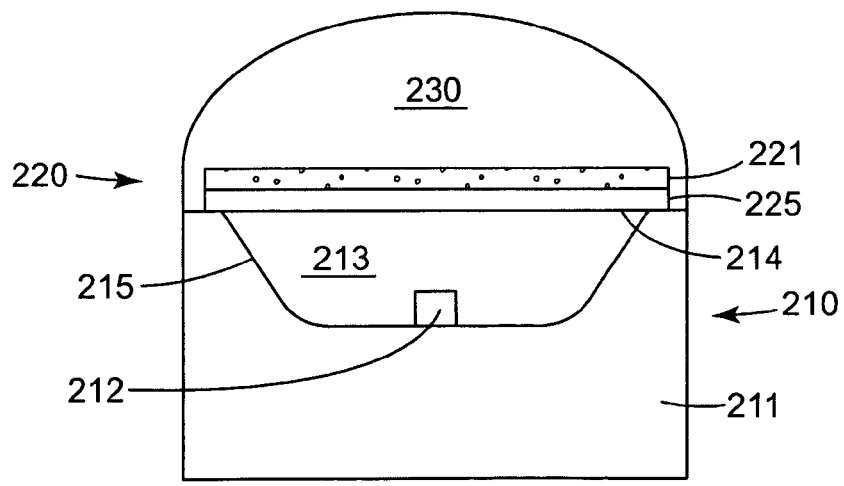
FIG. 4 is a schematic cross-sectional view of an illustrative light emitting device.

FIG. 4 is a schematic cross-sectional view of an illustrative light emitting device similar to that of FIG. 3, except that another encapsulating layer 230 has been formed over the phosphor tape 220. The encapsulating layer 230 can be formed of the same or different material forming the encapsulating material 213 within the housing 211.

Figure 5:
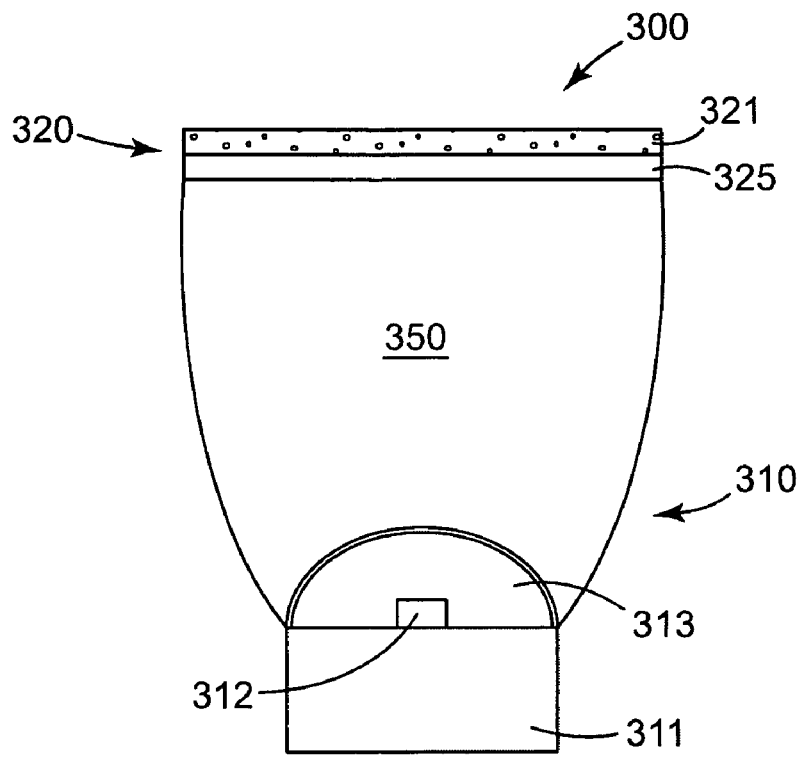
FIG. 5 is a schematic cross-sectional view of another illustrative light emitting device.

Light emitting devices can also include one or more layers or optical elements or components disposed between the encapsulated LED and the phosphor tape. Such a device is shown in schematic cross-sectional view in FIG. 5. There, light emitting device 300 includes a collimating optic disposed between an encapsulated LED die 312 and a phosphor tape 320. The phosphor tape 320 includes a pressure sensitive adhesive layer 325 (as described above) disposed between a phosphor layer 321 (as described above) and an LED 310. The LED 310 includes an optical element 350 such as, for example, a collimating optic. One or more optical elements 350 disposed between the encapsulated LED die 312 and the phosphor tape 320 can be considered to be part of a compound encapsulating body which also includes the encapsulating material 313. Thus, the phosphor tape 320 is disposed on the encapsulating material 313 and 350.

Figure 6:
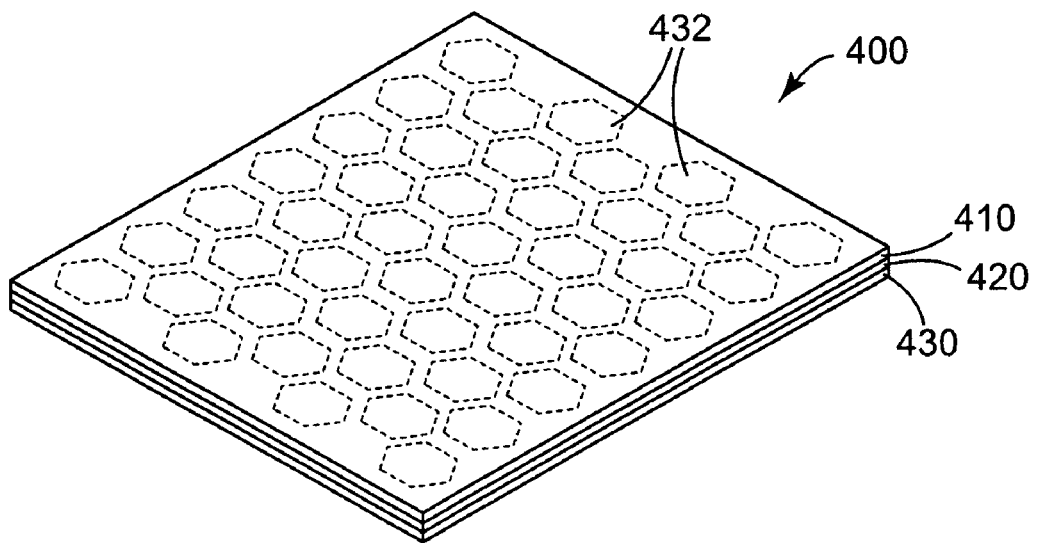
FIG. 6 is a perspective view of a sheet of phosphor tape.

FIG. 6 is a perspective view of a sheet of phosphor tape 400. The sheet of phosphor tape 400 includes a substantially uniform phosphor layer 410 disposed adjacent to or on a PSA layer 420 and an optional release layer 430 disposed on the PSA layer 420. The phosphor tape sheet 400 may also include a carrier or substrate film (not shown). The phosphor tape sheet can be subdivided by any means such as, for example, kiss-cut by mechanical means such as a knife, precision die cutting, or by scanning laser radiation as described in U.S. 2003/0217806 (Tait et al.). The kiss-cut lines define discrete pieces 432 of the sheet material 400, but exclusive of the carrier film (if present) which remains intact. The pieces 432 be of arbitrarily small size and shape sufficient to be disposed on individual or multiple LEDs.

Unless otherwise indicated, all numbers expressing quantities of elements, optical characteristic properties, and so forth used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

Weight percent, percent by weight, % by weight, and the like are synonyms that refer to the concentration of a substance as the weight of that substance divided by the weight of the composition and multiplied by 100.

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. Thus, for example, reference to a composition containing "a phosphor" includes a mixture of two or more phosphors. As used in this specification and the appended claims, the term "or" is generally employed in its sense including "and/or" unless the content clearly dictates otherwise.

The present invention should not be considered limited to the particular examples described herein, but rather should be understood to cover all aspects of the invention as fairly set out in the attached claims. Various modifications, equivalent processes, as well as numerous structures to which the present invention can be applicable will be readily apparent to those of skill in the art to which the present invention is directed upon review of the instant specification.

EXAMPLES

Unless otherwise noted, chemical reagents and solvents were or can be obtained from Aldrich Chemical Co., Milwaukee, Wisc.

Example 1

A sample of phosphor tape was made by applying a pressure sensitive adhesive to a phosphor-loaded film layer. The phosphor-loaded film layer contained cerium-doped yttrium aluminate (YAG:Ce) phosphor in a UV-curable binder. The phosphor-loaded film was made from a paste prepared by hand mixing 13.63 grams of YAG:Ce phosphor (designated QMK58/F-U1 by Phosphor Technology, Ltd. of Stevenage, England) into 20.45 grams of UV-curable resin (designated NOA 81 by Norland Products, Cranbury, N.J.). The paste was coated onto a sheet of polyethylene terphthalate (PET) by hand using the 100 micrometer gap of a square multiple clearance applicator (designated PAR-05353 by BYK-Gardner USA, Columbia, Md. The wet film was cured by placing it below a bank of UV bulbs (designated F15T8/350BL by Osram Sylvania, Danvers, Mass.) for about 5 minutes. A pressure-sensitive adhesive (designated Optically Clear Adhesive (OCA) specifically a cross-linked iso-octyl acrylate/acetic acid (90/10)PSA) was coated onto the exposed surface of the phosphor coating and covered with a protective release liner to produce a phosphor tape with the following layered construction: 1) PET carrier; 2) phosphor-loaded film; 3) pressure-sensitive adhesive; 4) release liner.

Example 2

The phosphor tape prepared in Example 1 was adhered to an encapsulated blue LED (commercially available from Stanley Electric Company, Tokyo, Japan) to produce a white LED. To attach the film, the release liner was removed and the LED top surface was placed against the exposed adhesive. The film was firmly pressed against the encapsulant to ensure that the adhesive touched the encapsulant and had a good optical contact. The film was cut to the size of the LED. The PET substrate was then peeled away from the phosphor-loaded layer, leaving just the phosphor-loaded layer bonded to the LED package by the pressure sensitive adhesive.

The optical output of the assembled white LED was measured using a spectroradiometer (designated OL 770-LED by Optronic Laboratories, Inc., Orlando, Fla.) fitted with an integrating sphere (designated OL IS-670-LED by Optronic Laboratories, Inc., Orlando, Fla.). The spectroradiometer was calibrated to report the radiant energy entering the integrating sphere at the input port as a function of the wavelength of light. The LED was powered by a constant-current source at a current of 20 milliamps. The emission from the assembled device appeared white and had a measured efficacy (lumens per Watt) of electrical power that was 25% greater than an identical construction without the PSA layer, where a piece of the same phosphor-loaded film layer was simply placed atop the encapsulated blue LED.

What is claimed is:

1. A phosphor tape article, comprising:
    a phosphor layer comprising a phosphor and a polymeric binder material, the phosphor having a decay rate of less than 1 second;
    a pressure sensitive adhesive layer disposed adjacent the phosphor layer, such that light transmitted through the pressure sensitive adhesive layer is received by the phosphor layer; and
    a release liner disposed on the pressure sensitive adhesive layer, wherein the pressure sensitive adhesive layer is disposed between the release liner and the phosphor layer;
    wherein the phosphor tape article is divided into discrete pieces whose size and shape are suitable for covering encapsulated LEDs.

2. An article according to claim 1, further comprising a hardcoat layer disposed on the phosphor layer, wherein the phosphor layer is disposed between the pressure sensitive adhesive layer and the hardcoat layer.

3. An article according to claim 1, wherein the pressure sensitive adhesive layer is disposed on the phosphor layer.

4. An article according to claim 1, wherein the pressure sensitive adhesive layer comprises a structured surface.

5. An article according to claim 1, wherein the pressure sensitive adhesive layer comprises a pressure sensitive adhesive that builds adhesion over a time interval.

6. An article according to claim 1, Wherein the pressure sensitive adhesive layer comprises a curing agent.

7. An article according to claim 1, wherein the phosphor layer has a haze value in a range from 50% to 100%.

8. An article according to claim 1, wherein the pressure sensitive adhesive layer comprises a silicone polymer.

9. An article according to claim 1, wherein the pressure sensitive adhesive layer comprises a photocuring agent.

10. A light emitting device, comprising:
    an encapsulated LED that includes an ultraviolet or blue light emitting LED die disposed within a transparent encapsulating material; and
    a phosphor tape disposed on the transparent encapsulating material, wherein the phosphor tape comprises:
        a phosphor layer including a phosphor and a polymeric binder material; and
        a pressure sensitive adhesive layer disposed adjacent the phosphor layer, wherein the pressure sensitive layer is disposed between the phosphor layer and the transparent encapsulating material and contacts the transparent encapsulating material.

11. A device according to claim 10, wherein the pressure sensitive adhesive layer further comprises an ultraviolet or blue light curing agent.

12. A device according to claim 10, wherein the encapsulating material has a first index of refraction, the pressure sensitive adhesive layer has a second index of refraction, and the phosphor layer polymeric binder material has a third index of refraction, and the first, second and third index of refractions all have a value within 0.1 at a visible wavelength.

13. A device according to claim 10, wherein the encapsulating material has a first index of refraction, the pressure sensitive adhesive layer has a second index of refraction, and the phosphor layer polymeric binder material has a third index of refraction, and the second index of refraction has a value between the first and third index of refraction.

14. A device according to claim 10, wherein the pressure sensitive adhesive layer contacts the phosphor layer.

15. A method of making a light emitting device, comprising:
    providing a phosphor tape sheet comprising a phosphor layer including a phosphor and a polymeric binder material, and a pressure sensitive adhesive layer adjacent the phosphor layer, the phosphor tape sheet being divided into discrete phosphor tape articles;
    providing an encapsulated LED including an LED die disposed within a transparent encapsulating material, the transparent encapsulating material having an encapsulant surface; and
    adhering one of the phosphor tape articles to the encapsulant surface.

16. A method according to claim 15, further comprising disposing a release liner on the pressure sensitive adhesive layer prior to providing a phosphor tape sheet step.

17. A method according to claim 15, wherein the LED die emits ultraviolet or blue excitation light and the light emitting device emits white light.

18. A method according to claim 15, further comprising forming a transparent body on the light emitting device to encapsulate at least a portion of the phosphor tape article.

19. A method according to claim 15, wherein the encapsulated LED includes a plurality of LED dies disposed within the transparent encapsulating material.

* * * * *